United States Patent
Huang et al.

(10) Patent No.: US 6,838,909 B2
(45) Date of Patent: Jan. 4, 2005

(54) BULK INPUT DIFFERENTIAL LOGIC CIRCUIT

(75) Inventors: Hong-Yi Huang, Taipei (TW); Jing-Fu Lin, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 126 days.

(21) Appl. No.: 10/307,371

(22) Filed: Dec. 2, 2002

(65) Prior Publication Data

US 2003/0214327 A1 Nov. 20, 2003

(30) Foreign Application Priority Data

May 20, 2002 (TW) ..................... 91110542 A

(51) Int. Cl.[7] .................................. H03K 19/096
(52) U.S. Cl. .................... 326/95; 326/121; 327/536
(58) Field of Search .................. 326/95, 98, 112, 326/115, 119, 121; 327/534, 536, 537

(56) References Cited

U.S. PATENT DOCUMENTS

| 3,879,621 A | 4/1975 | Cavaliere et al. |
| 4,570,084 A | 2/1986 | Griffin et al. |
| 6,433,589 B1 * | 8/2002 | Lee .................. 326/115 |

* cited by examiner

Primary Examiner—Daniel D. Chang
(74) Attorney, Agent, or Firm—Birch, Stewart, Kolasch & Birch, LLP

(57) ABSTRACT

A bulk input differential logic circuit. The circuit outputs a large signal high enough to assert a logic High and Low by variations of the threshold voltage controlled by the bulk input signal and amplification of the sense amplifier. A boost circuit is disposed on the bulk input terminal, which may receive multiple bulk input signals. This makes it possible to use fewer circuit elements and smaller circuit area for a complicated logic operation.

28 Claims, 12 Drawing Sheets

| A | B | $V_s$ | $I_L$ and $I_R$ | Q |
|---|---|---|---|---|
| 1 | ↑ | $V_t$ | $I_L > I_R$ | 1 |
| 1 | ↓ | $-V_{OL}$ | $I_L < I_R$ | 0 |
| 0 | ↑ | $V_t$ | $I_L < I_R$ | 0 |
| 0 | ↓ | $-V_{OL}$ | $I_L < I_R$ | 0 |

| A | B | $V_{s1}$ | $V_{s2}$ | $I_L$ and $I_R$ | Q |
|---|---|---|---|---|---|
| 1 | ↗ | $V_t$ | $-V_{OL}$ | $I_L < I_R$ | 0 |
| 1 | ↘ | $-V_{OL}$ | $V_t$ | $I_L > I_R$ | 1 |
| 0 | ↗ | $V_t$ | $-V_{OL}$ | $I_L > I_R$ | 1 |
| 0 | ↘ | $-V_{OL}$ | $V_t$ | $I_L < I_R$ | 0 |

BULK INPUT DIFFERENTIAL LOGIC CIRCUIT

This nonprovisional application claims priority under 35 U.S.C. § 119 (a) on Patent Application No. 091110542 filed in TAIWAN, R.O.C. on May 20, 2002, which is herein incorporated by reference.

BACKGROUND OF THE INVENTION

1. Field of the Invention

The present invention relates to a logic circuit and particularly to a bulk input differential logic circuit with fewer circuit elements for a complicated logic and high speed operation.

2. Description of the Prior Art

FIG. 1 is a diagram showing a static CMOS circuit of a 3-input NOR gate. It includes three P-type transistors 111, 112 and 113 having gates receiving signals A, B and C respectively, and three N-type transistors 121, 122 and 123 connected in parallel having gates receiving the signals A, B and C respectively. One of the N-type transistors 121, 122 and 123 is turned on and a logic Low is output on the terminal Vo if one of the signals A, B, and C carries a logic High. All of the P-type transistors 111, 112 and 113 are turned on and a logic High is output on the terminal Vo if all of the signals A, B, and C carry a logic Low. This circuit has an advantage in that there is no DC power consumption. However, it has a disadvantage in that 2n transistors are needed to implement a n-input NOR gate. The input capacitor of this circuit equals a sum of the gate capacitors of the P-type and N-type transistors. Thus, the circuit will operate at a relatively low speed if the number of the inputs is large.

FIG. 2 is a diagram showing a conventional dynamic CMOS circuit of a logic gate. It includes a P-type transistor 211 and a N-type transistor 212 having gates commonly coupled to receive a clock signal φ, and four transistors 221, 222, 223 and 224 having gates coupled to receive signals A, B, and their inverted signals A' and B' respectively. During a pre-charge period when the clock signal φ is at the logic Low, the transistor 211 is turned on and the logic High is output on the terminal Vo. During an evaluation period when the clock signal φ is at the logic High, the transistors 221, 222, 223 and 224 are turned on or off in response to the signals A and B. A current path from the terminal Vo to the ground is formed and the logic Low is output on the terminal Vo when both of the signals A and B carry the logic High or Low. Otherwise, the logic High is output on the terminal Vo. Thus, it operates as a logic function of Vo=AB+A'B'. Only (n+2) transistors are needed to implement a n-input logic gate. The can operate at a high speed even if the number of the inputs is large. However, it is possible that the terminal Vo floats under certain situations.

FIG. 3 is a diagram showing a conventional transmission gate. It includes P-type transistor 31 and N-type transistor 32. The gates of the transistors 31 and 32 respectively receive a signal B and its inverted signal B' and the source and drain of the transistors 31 and 32 are commonly coupled to receive another signal A and as an output terminal Vo. When the signal B carries the logic High, the terminal Vo is electrically connected to output the signal A. When the signal B carries the logic Low, the terminal Vo floats. Thus, the signal B acts as a switch control signal determining whether the signal A is transmitted to the terminal Vo. This circuit has a lower resistance but higher capacitance than those of the static CMOS circuit. The most serious problem with this circuit is that the terminal Vo is not biased by a DC voltage, which may result in wrong output due to power consumption in transmission.

FIG. 4 is a diagram showing a logic circuit using a differential cascade voltage switch (DCVS) disclosed in U.S. Pat. No. 4,570,084. It includes four P-type transistors 411, 412, 421 and 422, inverters 431 and 432, NMOS differential logic tree 44, and a N-type transistor 45. During a pre-charge period when the clock signal φ is at the logic Low, the transistors 412 and 421 are turned on and the logic High is output on the terminals Q and Q'. During an evaluation period when the clock signal φ is at the logic High, the NMOS differential logic tree 44 provides only current path to the ground, whereby one of the voltage levels on the terminals Q and Q' is pulled down to the logic Low. For example, the only current path provided by the NMOS differential tree 44 is from the terminal Q to the ground. The voltage level on the terminal F' is pulled up so that the N-type transistor 422 is turned on. This also helps to pull down the voltage level on the terminal Q to the logic Low and pull up the voltage level on the terminal F' to the logic High. The voltage level on the terminal Q' stays at the logic High, which keeps the transistor 411 turned on so that the voltage level on the terminal F is at the logic Low. This circuit has an advantage in that it operates at a relatively high speed and does not consume DC power. However, there are so many serially connected elements in the NMOS differential logic tree 44 that the current path is relatively long. This will deteriorate the operation speed and elongate the fall time of the output signal if there are a large number of input signals.

FIG. 5 is a diagram showing a logic circuit using a current latch sense amplifier disclosed in U.S. Pat. No. 3,879,621. It includes four P-type transistors 511, 512, 521 and 522, and five N-type transistors 531, 532, 541, 542 and 55. The transistors 511 and 512 are connected in parallel and have gates respectively coupled to receive a clock signal p and an output terminal OUT. The transistors 521 and 522 are connected in parallel and have gates respectively coupled to receive a clock signal φ and an output terminal OUT'. The transistors 531 and 532 have gates respectively coupled to the terminal OUT and OUT'. The transistors 541 and 542 have gates respectively coupled to receive an input signal IN and its inverted signal IN'. The gate of the transistor 55 is coupled to receive the clock signal φ. When the clock signal p is at the logic Low, the P-type transistors 511 and 522 are turned on, the N-type transistor 55 is turned off, the voltage level on the terminals OUT and OUT' is at the logic High, the transistors 512 and 521 are turned off, the transistors 531 and 532 are turned on, and the drains of the transistors 541 and 542 are coupled to the terminals OUT and OUT' to receive the logic High voltage thereon. When the clock signal φ is at the logic High, the transistors 511 and 522 are turned off and the transistor 55 is turned on. If the signal IN carries the logic High, the transistor 541 is turned on and the transistor 542 is turned off. A current path from the terminal OUT' to the ground is generated so that the voltage level on the terminal OUT' is pulled down. This gradually turns off the transistor 532 and turns on the transistor 531. The voltage level on the terminal OUT is also gradually pulled up to the logic High, which further helps to turn off the transistor 512 and turn on the transistor 531. Finally, the voltage levels on the terminals OUT and OUT' respectively reach the logic High and Low. Similarly, the voltage levels on the terminals OUT and OUT' respectively reach the logic Low and High If the signal IN carries the logic Low. Thus, the signal IN is amplified by the current latch sense amplifier.

FIG. 6 is a diagram showing a conventional threshold logic gate circuit. It includes two inverters 631 and 632, four P-type transistors 611, 612, 621 and 622, six N-type transistors 641, 642, 671 and 672, and a NMOS logic circuit 68. The transistors 611 and 612 are connected in parallel and have gates respectively coupled to receive a clock signal φ and the inverter 632. The transistors 521 and 522 are connected in parallel and have gates respectively 20' coupled to receive the clock signal φ and the inverter 631. The transistors 671 and 672 have gates respectively coupled to the inverters 632 and 631. The transistors 641 and 642 have gates commonly coupled to receive the clock signal φ. The NMOS logic circuit 68 includes (n+1) N-type transistors $65_1$~$65_{n+1}$ connected in parallel and having gates respectively coupled to receive n input signals $V_{x1}$~$V_{xn}$ and the logic High voltage, and (n+1) N-type transistors $66_1$~$66_{n+1}$ connected in parallel and having gates respectively coupled to receive n input signals $V_{y1}$~$V_{yn}$ and the logic Low voltage. The circuit operates in a pre-charge period when the clock signal φ is at the logic Low and operates in an evaluation period when the clock signal φ is at the logic High. At the beginning of the evaluation period, there are multiple current paths from the terminals Q and Q' to the ground formed by the turned-on transistors on two sides of the NMOS logic circuit 68 so that the voltage levels on the terminals Q and Q' are pulled down. The total current flowing through the current paths formed by the transistors on one side of the NMOS logic circuit will be larger than the other. This results in one of the voltages on the drains of the transistors 641 and 642 being pulled down faster than the other. For example, the voltage on the drain of the transistors 641 is pulled down faster than that on the drain of the transistors 642. The transistors 621 and 671 are more conductive than the transistors 612 and 672, which reversely pulls up the voltage on the drain of the transistor 642 and helps to pull down the voltage on the drain of the transistor 641. Finally, the voltage levels on the terminals Q and Q' respectively reach the logic High and Low. The sizes of the transistors in the NMOS logic circuit 68 determine the magnitudes of the currents flowing through the current paths and a logic function between the input signals $V_{x1}$~$V_{xn}$, and $V_{y1}$~$V_{yn}$, and the output signals on the terminals Q and Q'. However, this circuit only operates as limited logic functions.

SUMMARY OF THE INVENTION

The object of the present invention is to provide a new bulk input differential logic circuit composed of a current latch sense amplifier and a MOS logic circuit in which bulk transistors are used as terminals for input signals. The transistors in the MOS logic circuit can receive two of the input signals. This achieves a bulk input differential logic circuit with fewer circuit elements for a complicated logic and high speed operation.

The present invention provides a bulk input differential logic circuit. The circuit comprises a first and second transistor of a first type having sources commonly coupled to receive a first voltage, drains commonly coupled to a first output terminal and gates respectively coupled to receive a first signal and a second output terminal, a third and fourth transistor of the first type having sources commonly coupled to receive the first voltage, drains commonly coupled to the second output terminal and gates respectively coupled to receive the first signal and the first output terminal, a first and second transistor of a second type having drains respectively coupled to the first and second output terminal, gates respectively coupled to the second and first output terminal, a third transistor of the second type having a source coupled to receive a second voltage and a gate coupled to receive the first signal, and at least a fourth and fifth transistor of the second type having gates respectively coupled to receive at least one second signal and at least one third signal, bulks respectively coupled to receive at least one fourth signal and at least one fifth signal, drains respectively coupled to the sources of the first and second transistor of the second type, and sources commonly coupled to the drain of the third transistor of the second type, wherein the first and fourth transistor of the second type are serially connected to form a first current path, the second and fifth transistor of the second type are serially connected to form a second current path, and magnitudes of a first and second current flowing through the first and second current path are determined by the second and fourth signal, and the third and fifth signal, respectively.

The circuit described previously further comprises at least one boost circuit having at least one capacitor receiving at least one sixth signals and at least one seventh signal and providing the fourth and fifth signal, and a diode.

The capacitor may be a transistor of the first type having a bulk, source and drain commonly coupled to receive the sixth and seventh signal, and a gate outputting the fourth and fifth signal. The capacitor may be a transistor of the second type having a bulk, source and drain commonly coupled to receive the sixth and seventh signal, and a gate outputting the fourth and fifth signal. The capacitor may be a transistor of the first type having a bulk, source and drain commonly coupled to output the fourth and fifth signal, and a gate coupled to receive the sixth and seventh signal. The capacitor may be a transistor of the second type having a bulk, source and drain commonly coupled to output the fourth and fifth signal, and a gate coupled to receive the sixth and seventh signal.

The diode may be a transistor of the second type having a source coupled to receive the second voltage, and a gate and drain commonly coupled to receive the fourth and fifth signal. The diode may be a transistor of the first type having a source coupled to receive the second voltage, and a gate and drain commonly coupled to the fourth and fifth signal.

The capacitors, sixth and seventh signals are divided into groups if there is more than one capacitor, the capacitors of each group receive the sixth and seventh signals of one of the groups, and output the fourth and fifth signal.

The present invention further provides a bulk input differential logic circuit. The circuit comprises a first and second transistor of a first type having sources commonly coupled to receive a first voltage, drains commonly coupled to a first output terminal and gates respectively coupled to receive a first signal and a second output terminal, a third and fourth transistor of the first type having sources commonly coupled to receive the first voltage, drains commonly coupled to the second output terminal and gates respectively coupled to receive the first signal and the first output terminal, a first and second transistor of a second type having drains respectively coupled to the first and second output terminal, gates respectively coupled to the second and first output terminal, a third transistor of the second type having a source coupled to receive a second voltage and a gate coupled to receive the first signal, and a fourth and fifth transistor of the second type having bulks respectively coupled to receive a second signal and the second voltage, gates respectively coupled to receive a third signal and the first voltage, drains respectively coupled to the sources of the first and second transistor of the second type, and sources commonly coupled to the drain of the third transistor of the second type, wherein the first and fourth transistor of the second type are serially connected to form a first current path, the second and fifth transistor of the second type are serially connected to form a second current path, and the magnitude of a first current flowing through the first current path are determined by the second and third signal, and a magnitude of a second current flowing through the second path is constant.

The circuit described previously further comprises at least one boost circuit outputting the second signal, and having at least one capacitor and a diode.

The capacitor may be a transistor of the first type having a bulk, source and drain commonly coupled to receive a fourth signal, and a gate outputting the second signal. The capacitor is a transistor of the second type having a bulk, source and drain commonly coupled to receive a fourth signal, and a gate outputting the second signal. The capacitor may be a transistor of the first type having a bulk, source and drain commonly coupled to output the second signal, and a gate coupled to receive a fourth signal. The capacitor may be a transistor of the second type having a bulk, source and drain commonly coupled to output the second signal, and a gate coupled to receive a fourth signal.

The diode may be a transistor of the second type having a source coupled to receive the second voltage, and a bulk, gate and drain commonly coupled to receive the second signal. The diode may be a transistor of the first type having a source coupled to receive the second signal, a bulk coupled to receive the first voltage, and a gate and drain commonly coupled to receive the second voltage.

The capacitors are divided into groups if there are more than one, the capacitors of each group receiving one group of fourth signals and outputting the second signal.

The first type is P type, the second type is N type, the first voltage is VDD power supply voltage and the second voltage is ground voltage. Alternatively, the first type is N type, the second type is P type, the first voltage is ground voltage and the second voltage is VDD power supply voltage.

Thus, in the invention, a current latch sense amplifier amplifies the tiny variation of current resulting from the input signal on the bulks. This reduces the number of transistors used in the MOS logic circuit and also makes the circuit capable of operating for a more complicated logic function.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE INVENTION

Figure 1:
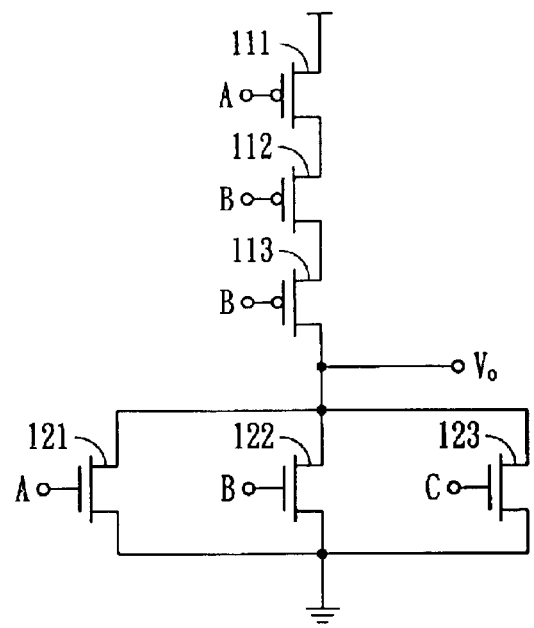
FIG. 1 is a diagram showing a static CMOS circuit of a 3-input NOR gate.
Figure 2:
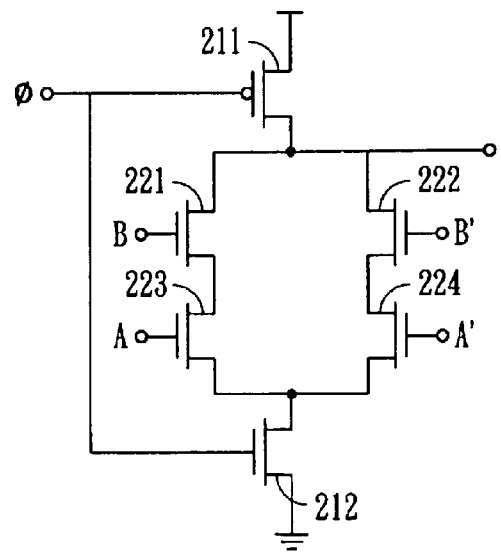
FIG. 2 is a diagram showing a conventional dynamic CMOS circuit of a logic gate.
Figure 3:
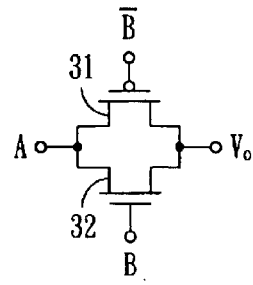
FIG. 3 is a diagram showing a conventional transmission gate.
Figure 4:
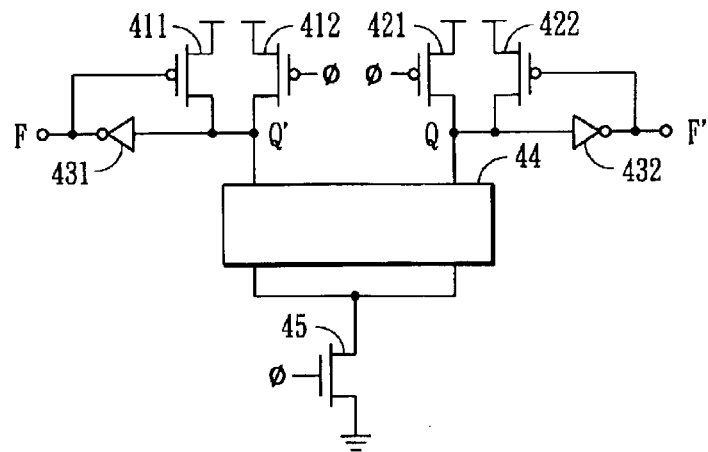
FIG. 4 is a diagram showing a logic circuit using a differential cascade voltage switch (DCVS) as disclosed in U.S. Pat. No. 4,570,084.
Figure 5:
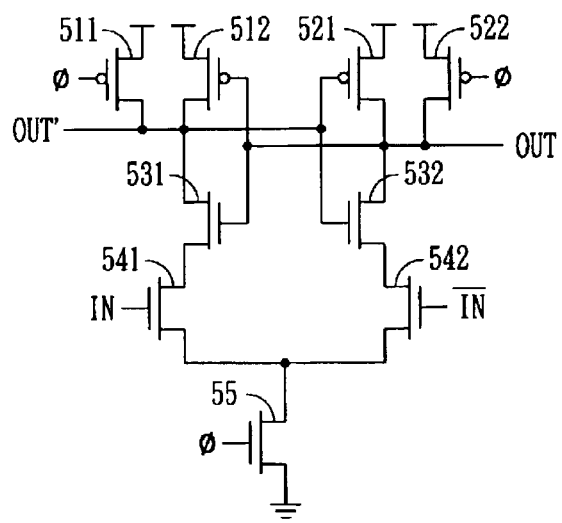
FIG. 5 is a diagram showing a logic circuit using a current latch sense amplifier as disclosed in U.S. Pat. No. 3,879,621.
Figure 6:
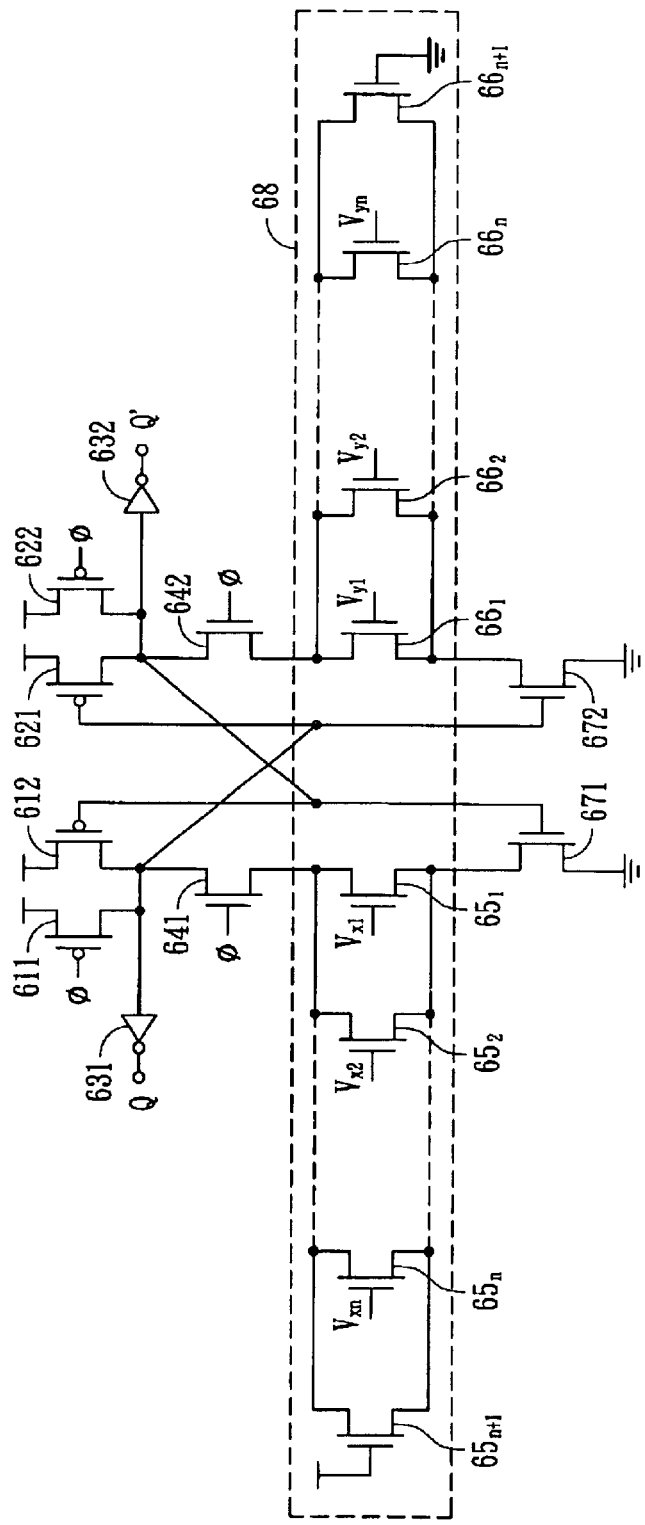
FIG. 6 is a diagram showing a conventional threshold logic gate circuit.
Figure 7:
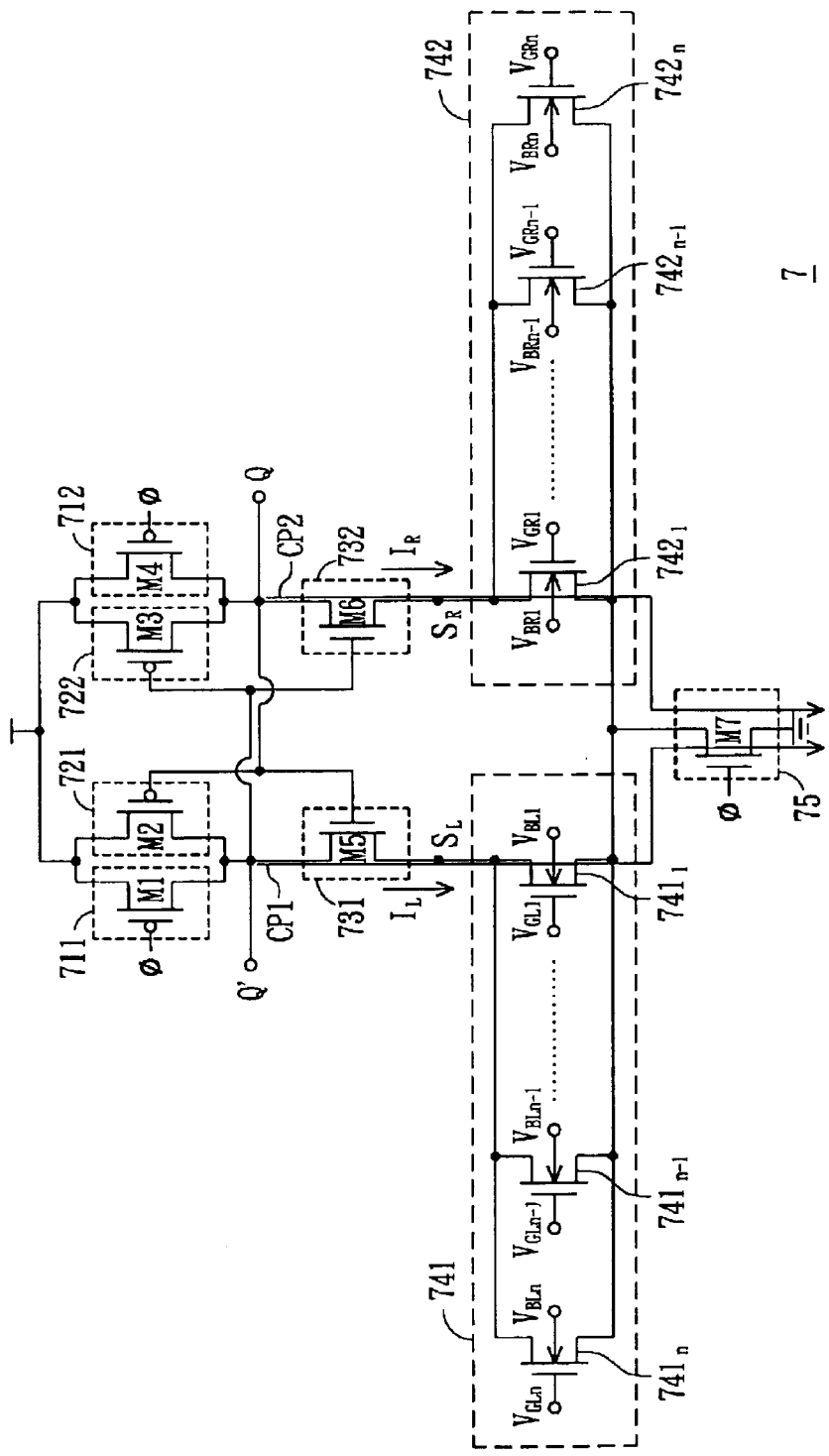
FIG. 7 is a diagram showing a bulk input differential logic circuit according to a first embodiment of the invention.

FIG. 7 is a diagram showing a bulk input differential logic circuit according to a first embodiment of the invention. Two current paths CP1 and CP2 are formed in the bulk input differential logic circuit 7. The current paths CP1 and CP2 are respectively connected between terminals Q and Q', and the ground. The bulk input differential logic circuit 7 includes seven switches 711, 712, 721, 722, 731, 732 and 75, and two NMOS logic circuit 741 and 742. The switch 731, NMOS logic circuit 741 and switch 75 form the current path CP1 while the switch 732, NMOS logic circuit 742 and switch 75 form the current path CP2. The terminals Q and Q' are respectively between the switches 721 and 731, and the switches 722 and 732.

Both of the switches 711 and 712 are controlled by a clock signal ϕ. They are opened when the clock signal ϕ is at a logic High and are closed when the clock signal ϕ is at a logic Low. The switches 711 and 712 are composed of P-type transistors M1 and M4 having gates coupled to receive the clock signal ϕ, sources coupled to receive a logic High voltage and drains coupled to the terminals Q' and Q.

Both of the switches 721 and 722 are controlled by voltage levels on the terminals Q and Q'. They are opened when the voltage levels on the terminals Q and Q' are at the logic High and are closed when the voltage levels on the terminals Q and Q' are at the logic Low. The switches 721 and 722 are composed of P-type transistors M2 and M3 having gates coupled to the terminals Q and Q', sources coupled to receive a logic High voltage, and drains coupled to the terminals Q' and Q.

Both of the switches 731 and 732 are controlled by voltage levels on the terminals Q and Q'. They are closed when the voltage levels on the terminals Q and Q' are at the logic High and are opened when the voltage levels on the terminals Q and Q' are at the logic Low. The switches 731 and 732 are composed of N-type transistors M5 and M6 having gates coupled to the terminals Q and Q', sources coupled to terminals $S_L$ and $S_R$, and drains coupled to the terminals Q' and Q.

The switch 75 is controlled by the clock signal P. It is closed when the clock signal φ is at the logic High and opened when the clock signal φ is at the logic Low. The switch 75 is composed of a N-type transistor M7 having a gate coupled to receive the clock signal φ, a source coupled to receive a logic High voltage and a drain coupled to the NMOS logic circuits 741 and 742.

The NMOS logic circuit 741 includes n N-type transistors $741_1$~$741_n$ connected in parallel between the switch 75 and the terminal $S_L$. The N-type transistors $741_1$~$741_n$ have gates respectively coupled to receive input signals $V_{GL1}$~$V_{GLn}$, and bulks coupled to receive input signals $V_{BL1}$~$V_{BLn}$. For each of the transistors $741_1$~$741_n$, the bulk input signal induces a drift of the threshold voltage, which results in variation of the current flowing through the transistor when the transistor is turned on by the input signal on its gate. Thus, the magnitude of the current flowing in the current path CP1 is determined by a combination of logic levels carried by the input signals $V_{GL1}$~$V_{GLn}$ and $V_{BL1}$~$V_{BLn}$.

Similarly, the NMOS logic circuit 742 includes n N-type transistors $742_1$~$742_n$ connected in parallel between the switch 75 and the terminal $S_R$. The N-type transistors $742_1$~$742_n$ have gates respectively coupled to receive input signals $V_{GR1}$~$V_{GRn}$, and bulks coupled to receive input signals $V_{BR1}$~$V_{BRn}$. For each of the transistors $742_1$~$742_n$, the bulk input signal induces a drift of the threshold voltage, which results in variation of the current flowing through the transistor when the transistor is turned on by the input signal on its gate. Thus, the magnitude of the current flowing in the current path CP2 is determined by a combination of logic levels carried by the input signals $V_{GR1}$~$V_{GRn}$ and $V_{BR1}$~$V_{BRn}$.

The operation of the circuit will be explained in the following. The bulk input differential circuit 7 alternatively operates in a pre-charge and evaluation period.

In the pre-charge period, the clock signal φ is at the logic Low. The switches 711 and 712 are closed (i.e., the transistors M1 and M4 are turned on), and the switch 75 is opened (i.e., the transistor M7 is turned off). The logic High voltage on the terminals Q' and Q opens the switches 722 and 721 (i.e., turns off the transistors M3 and M2), and closes the switch 732 and 731 (i.e., turns on the transistors M6 and M5). The voltages on the terminals SL and SR are charged to the logic High. In the pre-charged period, the input signals $V_{GL1}$~$V_{GLn}$, $V_{GR1}$~$V_{GRn}$, $V_{BL1}$~$V_{BLn}$, and $V_{BRL1}$~$V_{BRn}$ have no impact on the circuit operation since the switch 75 is opened.

In the evaluation period, the clock signal φ is at the logic High. The switches 711 and 712 are opened (i.e., the transistors M1 and M4 are turned off), and the switch 75 is closed (i.e., the transistor M7 is turned on). Since the voltages on the terminals SL and SR are previously charged to the logic High and the switch 75 is closed, the current path CP1 or CP2 is formed and discharging currents $I_L$ and $I_R$ are thereby generated which pull down the voltages on the terminal Q and Q' when one of the transistors $741_1$~$741_n$ and one of the transistors $742_1$~$742_n$ are turned on. The circuit 7 operates differently in the following relations between the currents $I_L$ and $I_R$.

When the current $I_L$ is larger than the current $I_R$, the voltage on the terminal Q' is pulled down faster than that on the terminal Q. The switches 722 and 732 are closed and opened (i.e., the transistors M3 and M6 are turned on and off) earlier than the other switches. This reversely pulls up the voltage on the terminal Q, which opens and closes the switches 721 and 731 (i.e., turns off the transistor M2 and turns on the transistor Ms). This further helps to pull down the voltage on the terminal Q'. Finally, the voltages on the terminals Q' and Q respectively reach the logic Low and High.

When the current $I_L$ is smaller than the current $I_R$, the voltage on the terminal Q is pulled down faster than that on the terminal Q'. The switches 721 and 731 are closed and opened (i.e., the transistors M2 and MS are turned on and off) earlier than the other switches. This reversely pulls up the voltage on the terminal Q', which opens and closes the switches 722 and 732 (i.e., turns off the transistor M3 and turns on the transistor M6). This further helps to pull down the voltage on the terminal Q. Finally, the voltages on the terminals Q and Q' respectively reach the logic Low and High.

Thus, it is noted that the relation between the currents IL and IR determines the output voltage levels on the terminals Q and Q'.

As previously described, the magnitudes of the currents $I_L$ and $I_R$ flowing in the current paths CP1 and CP2 are determined by combinations of logic levels carried by the input signals $V_{GR1}$~$V_{GRn}$, $V_{GL1}$~$V_{GLn}$, $V_{BL1}$~$V_{BLn}$, and $V_{BR1}$~$V_{BRn}$.

Accordingly, the output voltage levels on the terminals Q and Q' are determined by combinations of logic levels carried by the input signals $V_{GR1}$~$V_{GRn}$, $V_{GL1}$~$V_{GLn}$, $V_{BL1}$||$V_{BLn}$, and $V_{BR1}$~$V_{BRn}$.

Additionally, a boost circuit is added before the bulks to avoid circuit faults resulting from the forward bias of the junction between the drain/source and the substrate.

Figure 8:
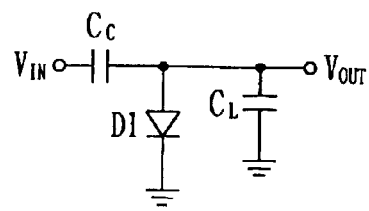
FIG. 8 is a diagram showing an equivalent circuit of a boost circuit used in the first embodiment of the invention.

FIG. 8 is a diagram showing an equivalent circuit of a boost circuit used in the first embodiment of the invention. The boost circuit includes a capacitor $C_C$ and a diode D1 with an anode coupled to the capacitor $C_C$ and a cathode coupled to receive the logic Low voltage. The boost circuit receives an input signal $V_{IN}$ and outputs a signal $V_{OUT}$ to the bulk of the transistor. The capacitor $C_L$ is the equivalent capacitance of a load on the output terminal.

Figure 9:
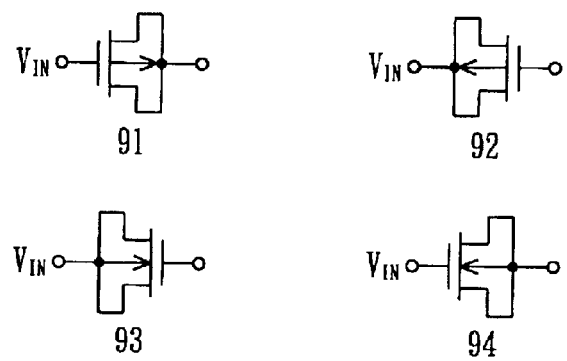
FIG. 9 is a diagram showing elements used as the capacitor $C_C$ shown in FIG. 8.

FIG. 9 is a diagram showing elements used as the capacitor $C_C$ shown in FIG. 8. The element 91 is a P-type transistor having a bulk, drain and source commonly coupled to the anode of the diode D1, and a gate coupled to receive the input signal $V_{IN}$. The element 92 is a P-type transistor having a bulk, drain and source commonly coupled to receive the input signal $V_{IN}$, and a gate coupled to the anode of the diode D1. The element 93 is a N-type transistor having a bulk, drain and source commonly coupled to receive the input signal V$_{IN}$, and a gate coupled to the anode of the diode D1. The element 94 is a N-type transistor having a bulk, drain and source commonly coupled to the anode of the diode D1, and a gate coupled to receive the input signal V$_{IN}$.

Figure 10:
FIG. 10 is a diagram showing elements used as the diode D1 shown in FIG. 8.

FIG. 10 is a diagram showing elements used as the diode D1 shown in FIG. 8. The element 101 is a N-type transistor having a bulk, gate and drain coupled together as the anode, and a source as the cathode coupled to the ground. The element 102 is a P-type transistor having a gate and drain coupled together as the cathode, a source as the anode, and a bulk coupled to receive the logic High voltage.

Figure 11:
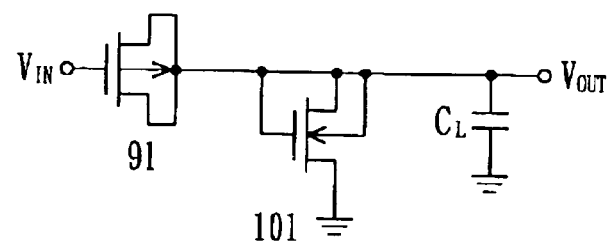
FIG. 11 is a diagram showing a boost circuit used in the first embodiment of the invention.

Therefore, there are 2×4=8 configurations for the boost circuit. For example, the boost circuit shown in FIG. 11 is composed of the elements 91 and 101. The input signals V$_{IN}$ and V$_{OUT}$ have a same wave form. The amplitude of the signal V$_{OUT}$ is (C$_C$×VDD)/(C$_C$+C$_L$) which is below the threshold voltage Vt of the transistor. This avoids the forward bias on the junction between the source/drain and the substrate of the transistor.

Figure 12:
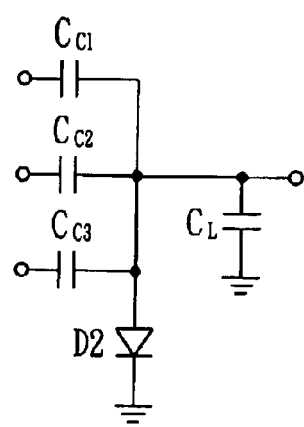
FIG. 12 is a diagram showing an equivalent circuit of a boost circuit with multiple inputs used in the first embodiment of the invention.

FIG. 12 is a diagram showing an equivalent circuit of a multi-input boost circuit with wired function used in the first embodiment of the invention. Accompanied with this multi-input boost circuit, the bulk input differential circuit in the first embodiment can be used for a more complicated logic operation. The capacitors C$_C$1, C$_C$2 and C$_C$3, and the diode D2 may be implemented by the elements 91~94, and 101 and 102 respectively.

Figure 13A:
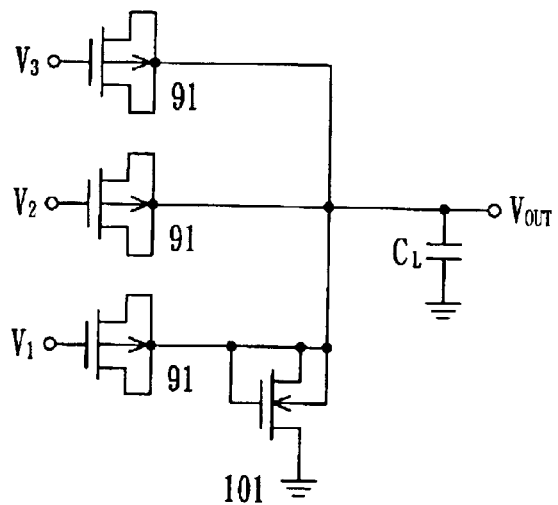
FIG. 13A is a diagram showing a boost circuit with multiple inputs used in the first embodiment of the invention.
Figure 13B:
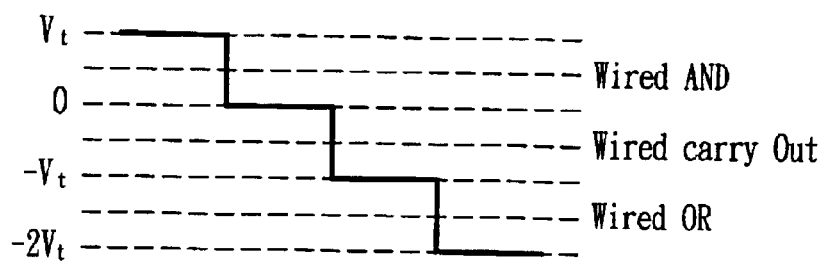
FIG. 13B is a diagram showing the relation between threshold voltages and logic functions according to the first embodiment of the invention.

FIG. 13A is a diagram showing a multi-input boost circuit used in the first embodiment of the invention. The capacitance C$_C$ is assumed to be equal to the capacitance C$_L$. As the signals V1, V2 and V3 are input to the boost circuit, there are four possible voltage levels, −2Vt, −Vt, 0 and Vt, of the signal V$_{OUT}$. As shown in FIG. 13B, if the critical voltage level to differentiate the logic High and Low is set between 0 and Vt, the boost circuit can implement AND operation for the signals V1, V2 and V3; if the critical voltage level to differentiate the logic High and Low is set between 0 and −Vt, the boost circuit can implement Carry-Out operation for the signals V1, V2 and V3; if the critical voltage level to differentiate the logic High and Low is set between −2Vt and −Vt, the boost circuit can implement OR operation for the signals V1, V2 and V3. Thus, the boost circuit helps to avoid the risk of circuit faults resulting from the forward bias on the junction between the drain/source and the substrate as well as to implement a more complicated logic operation.

FIGS. 14~17 show other different embodiments of the invention obtained by combining the boost circuits shown in FIG. 8 with the bulk input differential logic circuit in the first embodiment.

Figures 14A, 14B:
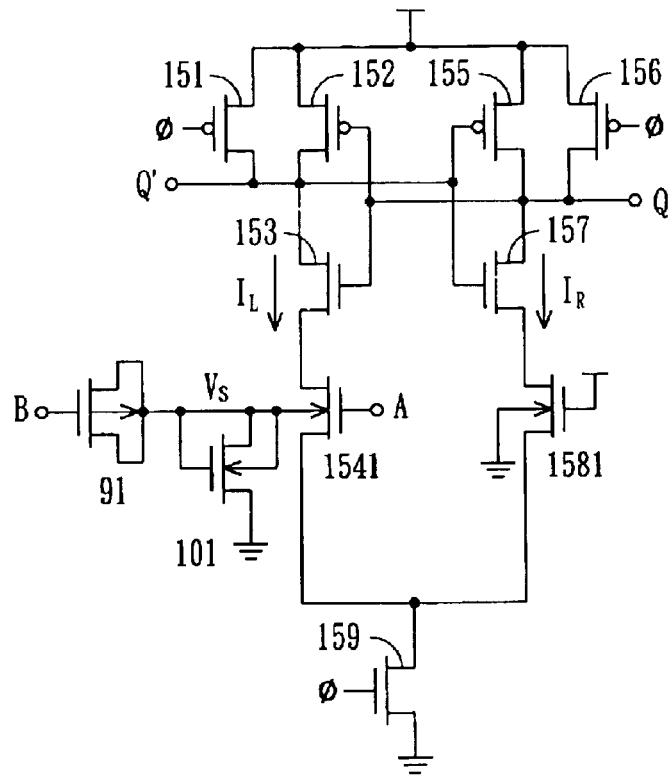
FIGS. 14A and 14B are diagrams showing a bulk input differential logic circuit and its truth table according to a second embodiment of the invention.

FIG. 14A is a diagram showing a bulk input differential logic circuit according to a second embodiment of the invention. The bulk input differential logic circuit includes four P-type transistors 151, 152, 155 and 156, five N-type transistors 153, 157, 159, 1581 and 1541, and a boost circuit composed of transistors 91 and 101. The P-type transistors 151, 152 have drains commonly coupled to receive the logic High voltage, sources commonly coupled to the terminal Q', and gates respectively coupled to receive a clock signal φ and the terminal Q. The P-type transistors 155 and 156 have drains commonly coupled to receive the logic High voltage, sources commonly coupled to the terminal Q, and gates respectively coupled to the terminal Q and to receive the clock signal φ. The N-type transistors 153 and 157 have drains respectively coupled to the terminal Q' and Q, and gates respectively coupled to the terminals Q and Q'. The N-type transistor 1541 has a drain coupled to the source of the N-type transistor 153, a gate coupled to receive an input signal A, a source coupled to the drain of the N-type transistor 159, and a bulk coupled to receive a signal Vs which is generated by the boost circuit composed of the transistors 91 and 101 with an input signal B. The N-type transistor 1581 has a drain coupled to the source of the N-type transistor 157, a gate coupled to receive the logic High voltage, a source coupled to the drain of the N-type transistor 159, and a bulk coupled to the ground. The gate and source of the N-type transistor 159 are respectively coupled to receive the clock signal φ and the ground.

FIG. 14B shows a truth table of the bulk input logic circuit in FIG. 14A. Therefrom, the bulk input logic circuit in FIG. 14A implements AND operation of the signals A and B.

Figures 15A, 15B:
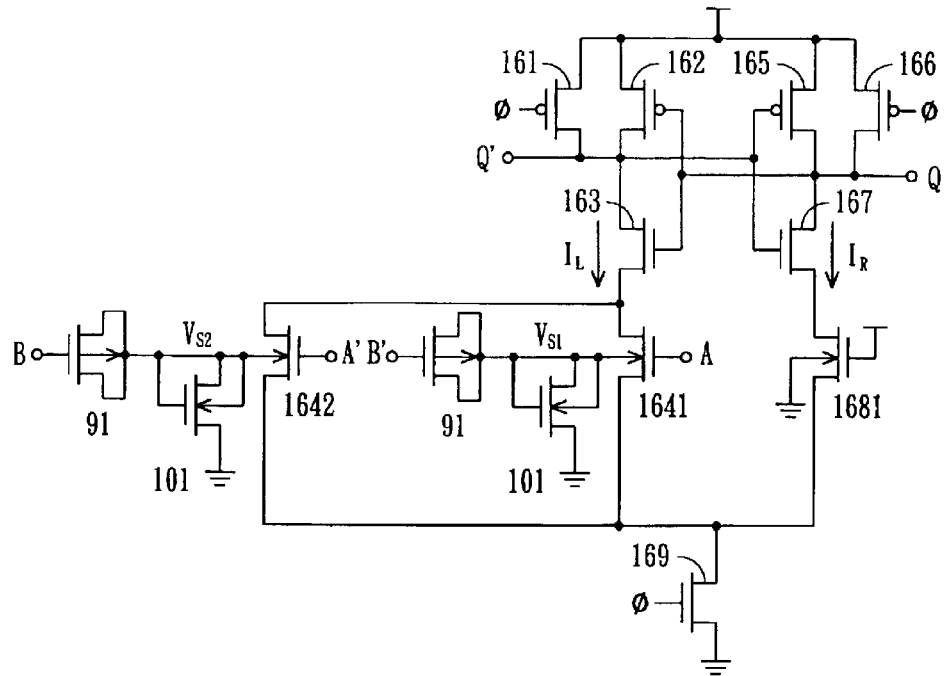
FIGS. 15A and 15B are diagrams showing a bulk input differential logic circuit and its truth table according to a third embodiment of the invention.

FIG. 15A is a diagram showing a bulk input differential logic circuit according to a third embodiment of the invention. The bulk input differential logic circuit includes four P-type transistors 161, 162, 165 and 166, six N-type transistors 163, 167, 169, 1681, 1641 and 1642, and a boost circuit composed of transistors 91 and 101. It is noted that the circuit shown in FIG. 15A is similar to that in FIG. 14A except that the circuit in FIG. 15A has the transistors 1641 and 1642 receiving the input signals A, A', B and B'.

FIG. 15B shows a truth table of the bulk input logic circuit in FIG. 15A. Therefrom, the bulk input logic circuit in FIG. 15A implements XOR operation of the signals A and B.

Figure 16:
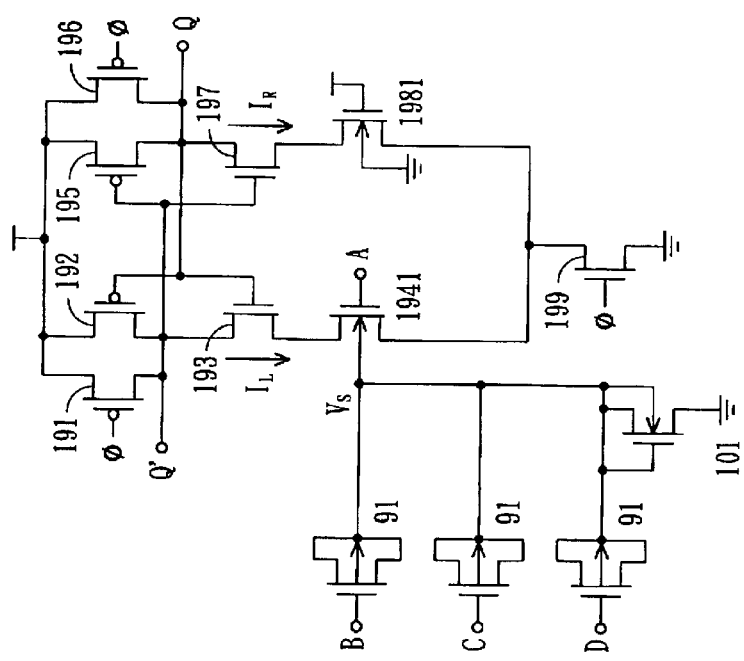
FIG. 16 is a diagram showing a bulk input differential logic circuit according to a fourth embodiment of the invention.

FIG. 16 is a diagram showing a bulk input differential logic circuit according to a fourth embodiment of the invention. It includes four P-type transistors 191, 192, 195 and 196, five N-type transistors 193, 197, 199, 1981, and 1941, and a boost circuit composed of transistors 91 and 101. It is noted that the circuit shown in FIG. 16 is similar to that in FIG. 15A except that the boost circuit is a multi-input boost circuit receiving three input signals B, C and D. When the critical voltage level to differentiate the logic High and Low is set between −Vt and −2Vt, the bulk input differential circuit implements a logic function Q=A (B+C+D). Thus, it is a OAI logic gate.

Figure 17A:
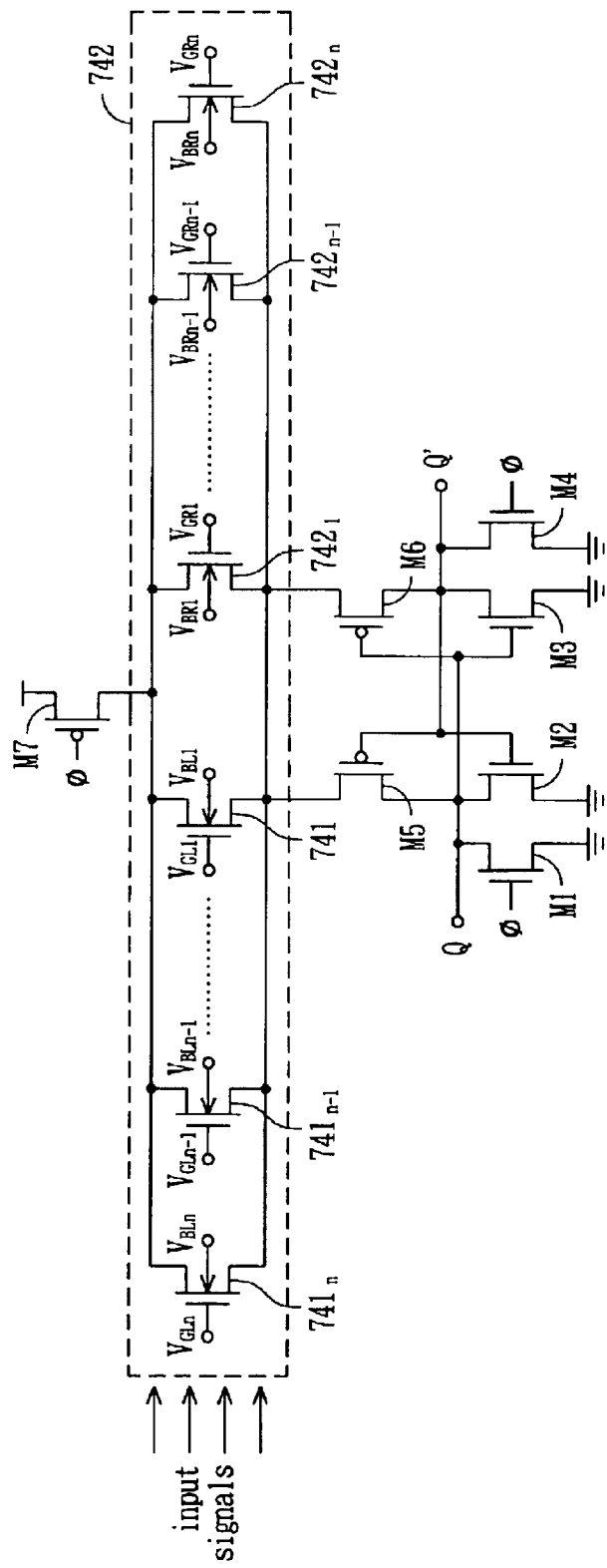
FIG. 17A is a diagram showing a bulk input differential logic circuit according to a fifth embodiment of the invention.
Figure 17B:
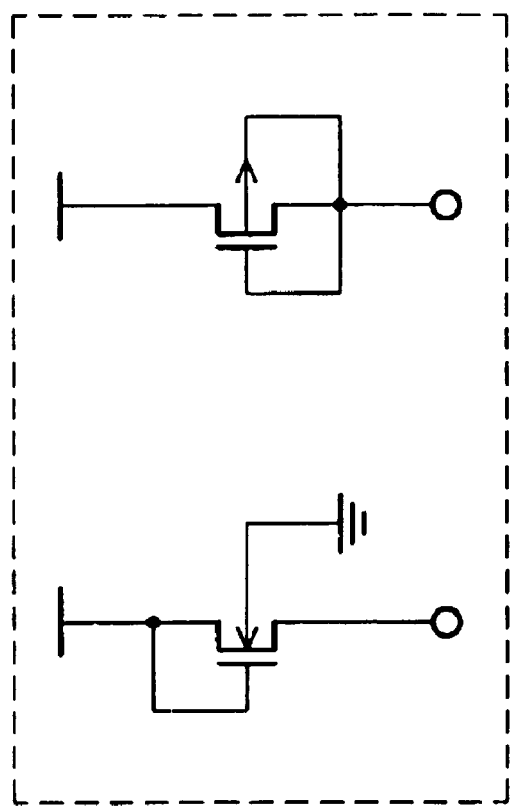
FIG. 17B is a diagram showing a boost circuit used in the fifth embodiment of the invention.

FIG. 17A is a diagram showing a bulk input differential logic circuit according to a fifth embodiment of the invention. It is similar to the circuit shown in FIG. 7 except that all the N-type transistors are substituted by P-type transistors and all the P-type transistors are substituted by N-type transistors. FIG. 17B is a diagram showing a boost circuit used in the fifth embodiment of the invention. In contrast, it is used to keep the amplitude of the input signals above the threshold voltage.

In conclusion, the bulks of the transistors in the NMOS logic circuit are used receive the input signals and a boost circuit is disposed before the bulks. The boost circuit avoids circuit faults resulting from the forward bias on the junction between the source/drain and the substrate of the transistors, and helps to implement a more complicated logic operation. This archives a bulk input differential logic circuit with fewer circuit elements capable of implementing a complicated logic and high speed operation.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bulk input differential logic circuit comprising:

first and second transistors of a first type having sources commonly coupled to receive a first voltage, drains commonly coupled to a first output terminal and gates respectively coupled to receive a first signal and a second output terminal;

third and fourth transistors of the first type having sources commonly coupled to receive the first voltage, drains commonly coupled to the second output terminal and gates respectively coupled to receive the first signal and the first output terminal;

first and second transistors of a second type having drains respectively coupled to the first and second output terminal, gates respectively coupled to the second and first output terminal;

a third transistor of the second type having a source coupled to receive a second voltage and a gate coupled to receive the first signal;

at least one fourth transistor of the second type having a gate coupled to receive at least one second signal, a bulk coupled to receive at least one fourth signal, a drain coupled to the sources of the first and second transistors of the second type, and a source coupled to the drain of the third transistor of the second type;

at least one fifth transistor of the second type having a gate coupled to receive at least one third signal, a bulk coupled to receive at least one fifth signal, a drain coupled to the sources of the first and second transistors of the second type, and a source coupled to the drain of the third transistor of the second type; and wherein the first and fourth transistors of the second type are serially connected to form a first current path, the second and fifth transistors of the second type are serially connected to form a second current path, magnitudes of a first and second currents flowing through the first and second current paths are determined by the second and fourth signals, and the third and fifth signals, respectively, the second signal differs from the third signal, and the fourth signal differs from the fifth signal.

2. The circuit as claimed in claim 1, wherein the fourth and fifth transistors of the second type are in parallel if there are more than one each thereof.

3. The circuit as claimed in claim 1, wherein the first and third transistors of the first type, and the third transistor of the second type are controlled by the first signal, in which, during a first period, the first and third transistors of the first type are turned on and the third transistor of the second type is turned off by the first signal so that the first voltage is generated on the first and second output terminals to turn off the second and fourth transistors of the first type and turn on the first and second transistors of the second type, and during a second period, the first and third transistors of the first type are turned off and the third transistor of the second type is turned on by the first signal.

4. The circuit as claimed in claim 1, wherein the first current is generated by the fourth transistor of the second type based on a combination of logic levels of the second and fourth signals, and the second current is generated by the fifth transistor of the second type based on a combination of logic levels of the third and fifth signals.

5. The circuit as claimed in claim 1, wherein the first type is P type, the second type is N type, the first voltage is VDD power supply voltage and the second voltage is ground voltage.

6. The circuit as claimed in claim 1, wherein the first type is N type, the second type is P type, the first voltage is ground voltage and the second voltage is VDD power supply voltage.

7. The circuit as claimed in claim 1 further comprising:

at least one boost circuit comprising:

at least one capacitor receiving a sixth signal and providing the fourth signal; and a diode coupled to receive the fourth signal and the second voltage.

8. The circuit as claimed in claim 7, wherein the capacitor is a transistor of the first type having a bulk, source and drain commonly coupled to receive the sixth signal, and a gate outputting the fourth signal.

9. The circuit as claimed in claim 7, wherein the capacitor is a transistor of the second type having a bulk, source and drain commonly coupled to receive the sixth signal, and a gate outputting the fourth signal.

10. The circuit as claimed in claim 7, wherein the capacitor is a transistor of the first type having a bulk, source and drain commonly coupled to output the fourth signal, and a gate coupled to receive the sixth signal.

11. The circuit as claimed in claim 7, wherein the capacitor is a transistor of the second type having a bulk, source and drain commonly coupled to output the fourth signal, and a gate coupled to receive the sixth signal.

12. The circuit as claimed in claim 7, wherein the diode is a transistor of the second type having a source coupled to receive the second voltage, and a bulk, gate, and drain commonly coupled to receive the fourth signal.

13. The circuit as claimed in claim 7, wherein the diode is a transistor of the first type having a source coupled to receive the fourth signal, a bulk coupled to receive the first voltage, and a gate and drain commonly coupled to the second voltage.

14. The circuit as claimed in claim 7, wherein the first type is P type, the second type is N type, the first voltage is VDD power supply voltage and the second voltage is ground voltage.

15. The circuit as claimed in claim 7, wherein the first type is N type, the second type is P type, the first voltage is ground voltage and the second voltage is VDD power supply voltage.

16. A bulk input differential logic circuit comprising:

first and second transistors of a first type having sources commonly coupled to receive a first voltage, drains commonly coupled to a first output terminal and gates respectively coupled to receive a first signal and a second output terminal;

third and fourth transistors of the first type having sources commonly coupled to receive the first voltage, drains commonly coupled to the second output terminal and gates respectively coupled to receive the first signal and the first output terminal;

first and second transistors of a second type having drains respectively coupled to the first and second output terminal, and gates respectively coupled to the second and first output terminal;

third transistor of the second type having a source coupled to receive a second voltage and a gate coupled to receive the first signal; and fourth and fifth transistors of the second type having bulks respectively coupled to receive a second signal and the second voltage, gates respectively coupled to receive a third signal and the first voltage, drains respectively coupled to the sources of the first and second transistors of the second type, and sources commonly coupled to the drain of the third transistor of the second type;

wherein the first and fourth transistors of the second type are serially connected to form a first current path, the second and fifth transistors of the second type are serially connected to form a second current path, and a magnitude of a first current flowing through the first current path is determined by the second and third signals, and a magnitude of a second current flowing through the second path is constant.

17. The circuit as claimed in claim 16, wherein the first type is P type, the second type is N type, the first voltage is VDD power supply voltage and the second voltage is ground voltage.

18. The circuit as claimed in claim 16, wherein the first type is N type, the second type is P type, the first voltage is ground voltage and the second voltage is VDD power supply voltage.

19. The circuit as claimed in claim 16 further comprising at least one boost circuit outputting the second signal, and having a capacitor receiving a fourth signal and outputting the second signal and a diode coupled to receive the second voltage and the second signal.

20. The circuit as claimed in claim 19, wherein the capacitor is a transistor of the first type having a bulk, source and drain commonly coupled to receive a the fourth signal, and a gate outputting the second signal.

21. The circuit as claimed in claim 19, wherein the capacitor is a transistor of the second type having a bulk, source and drain commonly coupled to receive e the fourth signal, and a gate outputting the second signal.

22. The circuit as claimed in claim 19, wherein the capacitor is a transistor of the first type having a bulk, source and drain commonly coupled to output the second signal, and a gate coupled to receive the fourth signal.

23. The circuit as claimed in claim 19, wherein the capacitor is a transistor of the second type having a bulk, source and drain commonly coupled to output the second signal, and a gate coupled to receive the fourth signal.

24. The circuit as claimed in claim 19, wherein the diode is a transistor of the second type having a source coupled to receive the second voltage, and a bulk, gate and drain commonly coupled to receive the second signal.

25. The circuit as claimed in claim 19, wherein the diode is a transistor of the first type having a source coupled to receive the second signal, a bulk coupled to receive the first voltage, and a gate and drain commonly coupled to receive the second voltage.

26. The circuit as claimed in claim 19, wherein the capacitors are divided into groups if there are more than one capacitors, and the capacitors of each group receive one group of fourth signals and output the second signal.

27. The circuit as claimed in claim 19, wherein the first type is P type, the second type is N type, the first voltage is VDD power supply voltage and the second voltage is ground voltage.

28. The circuit as claimed in claim 19, wherein the first type is N type, the second type is P type, the first voltage is ground voltage and the second voltage is VDD power supply voltage.

* * * * *